United States Patent
Duffy et al.

(10) Patent No.: US 6,513,127 B1
(45) Date of Patent: Jan. 28, 2003

(54) FREQUENCY DIFFERENCE DETECTOR WITH PROGRAMMABLE CHANNEL SELECTION

(75) Inventors: Michael L. Duffy, Austin, TX (US); James H. Jones, Granger, TX (US)

(73) Assignee: Cypress Semiconductor Corp., San Jose, CA (US)

(*) Notice: Subject to any disclaimer, the term of this patent is extended or adjusted under 35 U.S.C. 154(b) by 0 days.

(21) Appl. No.: 09/405,626

(22) Filed: Sep. 24, 1999

(51) Int. Cl.[7] .................................................. G06F 1/06
(52) U.S. Cl. ........................ 713/501; 370/431; 370/464
(58) Field of Search .......................... 331/501; 455/264, 455/522, 436; 325/17; 713/501; 370/281, 302, 376, 307, 348, 431, 464; 341/825.5

(56) References Cited

U.S. PATENT DOCUMENTS

| | | | | |
|---|---|---|---|---|
| 4,161,695 A | * | 7/1979 | Kakigi | ........................ 325/17 |
| 5,062,105 A | * | 10/1991 | McKnight et al. | ............. 370/84 |
| 5,552,838 A | * | 9/1996 | Suizu | ........................ 348/735 |
| 5,606,290 A | * | 2/1997 | Pang | ........................... 331/1 A |
| 5,952,888 A | | 9/1999 | Scott | ............................. 331/2 |
| 6,006,078 A | * | 12/1999 | Yamammoto et al. | ...... 455/264 |

FOREIGN PATENT DOCUMENTS

JP           402071609 A    *   3/1990           H03J/7/28

OTHER PUBLICATIONS 3.3V Quad SONET Transceiver, CY7B9514V, Cypress Semiconductor Corporation, Sep. 8, 1998, pp. 1–13.
Michael Duffy, "Frequency Difference Detector With Hysteresis", Ser. No. 09/015,989, Filed Jan. 30, 1998.

\* cited by examiner

*Primary Examiner*—Thomas Lee
*Assistant Examiner*—Nitin Patel
(74) *Attorney, Agent, or Firm*—Christopher P. Maiorana, P.C.

(57) ABSTRACT

An apparatus comprising a first circuit configured to present one or more control indication signals and (ii) a control clock signal in response to (i) one or more select signals, (ii) one or more clock signals and (iii) one or more divider control signals. The first circuit may be configured to select an active channel from a plurality of channels in response to the one or more select signals.

20 Claims, 10 Drawing Sheets

FREQUENCY DIFFERENCE DETECTOR WITH PROGRAMMABLE CHANNEL SELECTION

FIELD OF THE INVENTION

The present invention relates to frequency detectors generally and, more particularly, to a frequency difference detector with a programmable number of channels.

BACKGROUND OF THE INVENTION

Conventional frequency difference detectors have a fixed number of channels. For multi-channel applications, one or more channels can be powered down. If a particular channel is powered down, there is no need to evaluate the powered down channel. An example of a conventional multi-channel frequency difference detector may be found in co-pending U.S. application Ser. No. 09/047,595, now U.S. Pat. No. 5,952,888, which is incorporated by reference in its entirety.

Conventional frequency difference detectors typically rely on ripple counters, which are slow and not easily scaled to high speed operation (e.g., 1–3 Gigabits/s data rates). Conventional frequency difference detectors lack (i) an output for further synchronous processing and (ii) a test clock input. In addition, with a Block Based Design Methodology (BBDM) it is preferable that the same frequency difference detector (FDD) be implemented on multiple end products without modification. Such an implementation is inefficient with conventional approaches. Commercial products may have a different numbers of channels (e.g., one channel may be needed for a single channel device, and four channels may be needed for a quad channel device, etc.).

SUMMARY OF THE INVENTION

The present invention concerns an apparatus comprising a first circuit configured to present one or more control indication signals in response to (i) one or more select signals, (ii) one or more clock signals and (iii) one or more divider control signals. The first circuit may be configured to select an active channel from a plurality of channels in response to the one or more select signals.

The objects, features and advantages of the present invention include providing a frequency difference detector that may (i) have a user programmable channel count mechanism, (ii) have a timing pulse generation sub-block, (iii) be implemented with polynomial counters including trap and overrange circuitry optimized for polynomial counters, (iv) have an output OOLICLK, and/or (v) have a test clock input.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

The present invention may operate as a frequency difference detector (FDD). The present invention may have an input that may receive a reference clock signal (e.g., REFCLK) and a number of inputs (e.g., RXPLL Clock) that may receive a number of signals (e.g., RXCLK). The frequency of one of the signals RXCLK is generally compared to the frequency of the signal REFCLK. If the difference exceeds a threshold, an Out-of-Lock Indicator signal (e.g., OOLI) for the particular channel being checked is asserted. The present invention may have a user selectable channel count (e.g., 1 to N, where N is an integer), which can be changed on the fly (e.g., without powering down the present invention). In addition, the present invention may implement a number of polynomial counters that may have overrange control and trap state detection and/or correction. The present invention may also implement (i) a test clock input, (ii) a signal OOLICKL for post processing of the signal OOLI, and/or (iii) a timing pulse generation circuit.

Figure 1:
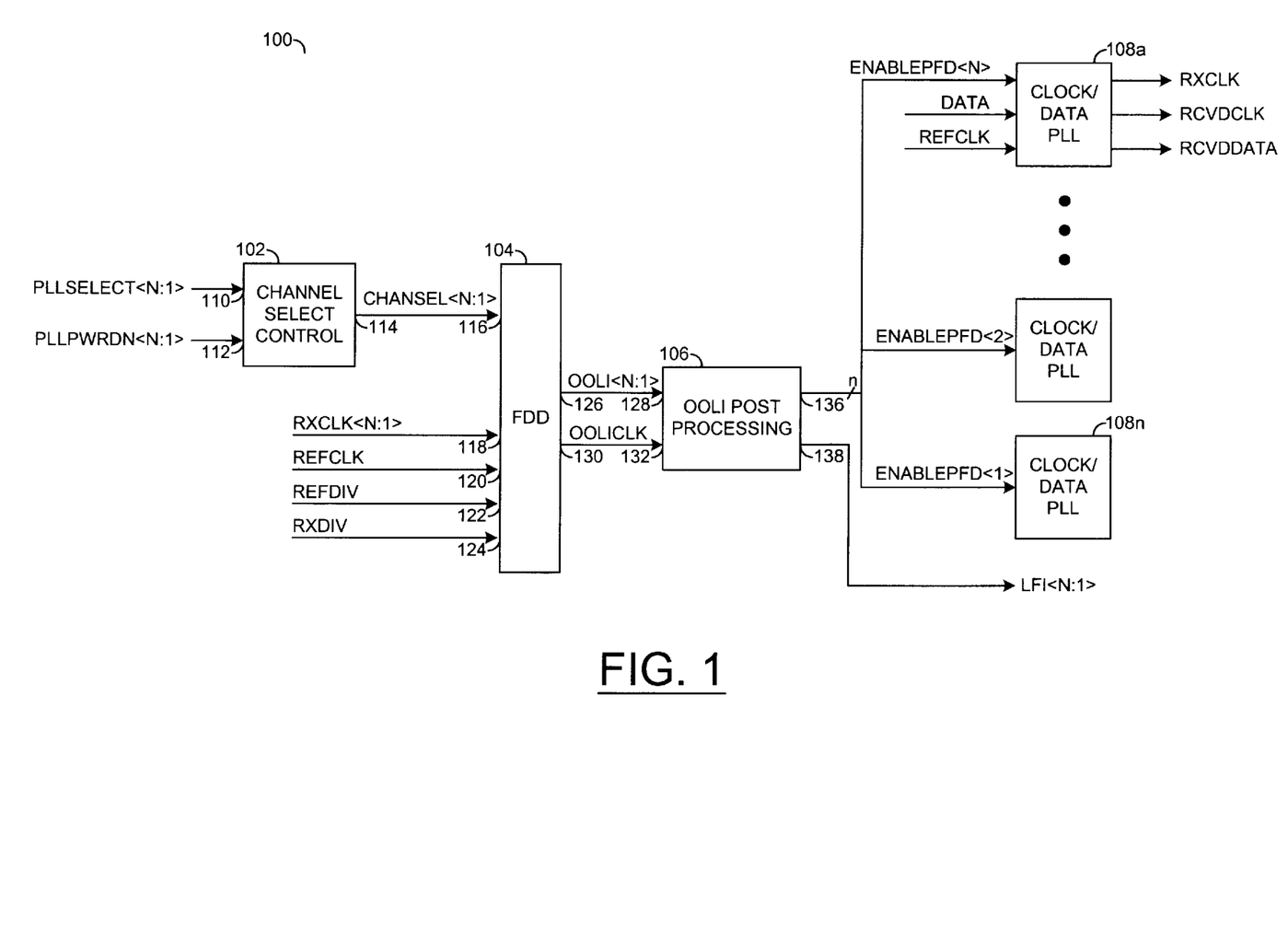
FIG. 1 is a block diagram of a preferred embodiment of the present invention.

Referring to FIG. 1, a block diagram of a circuit 100 is shown in accordance with a preferred embodiment of the present invention. The circuit 100 generally comprises an input block, a channel select control block (or circuit) 102 and a frequency difference detector (FDD) 104 and a post processing block (or circuit) 106. The circuit 100 may be connected to a number of clock/data PLLs 108a–108n. The clock/data PLLs may receive a data input signal (e.g., DATA), a clock input signal (e.g., REFCLK) and may present a recovered data signal (e.g., RCVDDATA), a recovered clock signal (e.g., RCVDCLK) and a clock signal (e.g., RXCLK), each to be described in more detail in connection with FIG. 7.

The channel select control circuit1 102 may have an input 110 that may receive a first select signal (e.g., PLLSELECT<N:1>), an input 112 that may receive a signal (e.g., PLLPWRDN<N: 1>) and an output 114 that may present a signal (eg, C SEL<N:1>). The signal CHANSEL<N:1>may be pres ented to input 116 of e frequency difference detector circuit 104. The signal PLLPWRDN<N:1>may comprise one or more external power down signals.

The frequency difference detector circuit 104 may have an input 118 that may receive a signal (e.g., RXCLK<N:1>) from the PLLs 108a–108n, an input 120 that may receive the signal REFCLK, an input 122 that may receive a signal (e.g., REFDIV), and an input 124 that may receive a signal (e.g., RXDIV). The frequency difference detector 104 may have an output 126 that may present a signal (e.g., OOLI<N:1>) that may be presented to an input 128 of the post processing circuit 106. The frequency difference detector 104 may have an output 130 that may present a signal (e.g., OOLICLK) to an input 132 of the post processing circuit 106. The post processing circuit 106 may have an output 136 that may present a number of enable signals (e.g., ENABLEPFD<N:1>) to the PLLs 108a–108n and an output 138 that may present a signal (e.g., LFI<N:1>).

Figure 2:
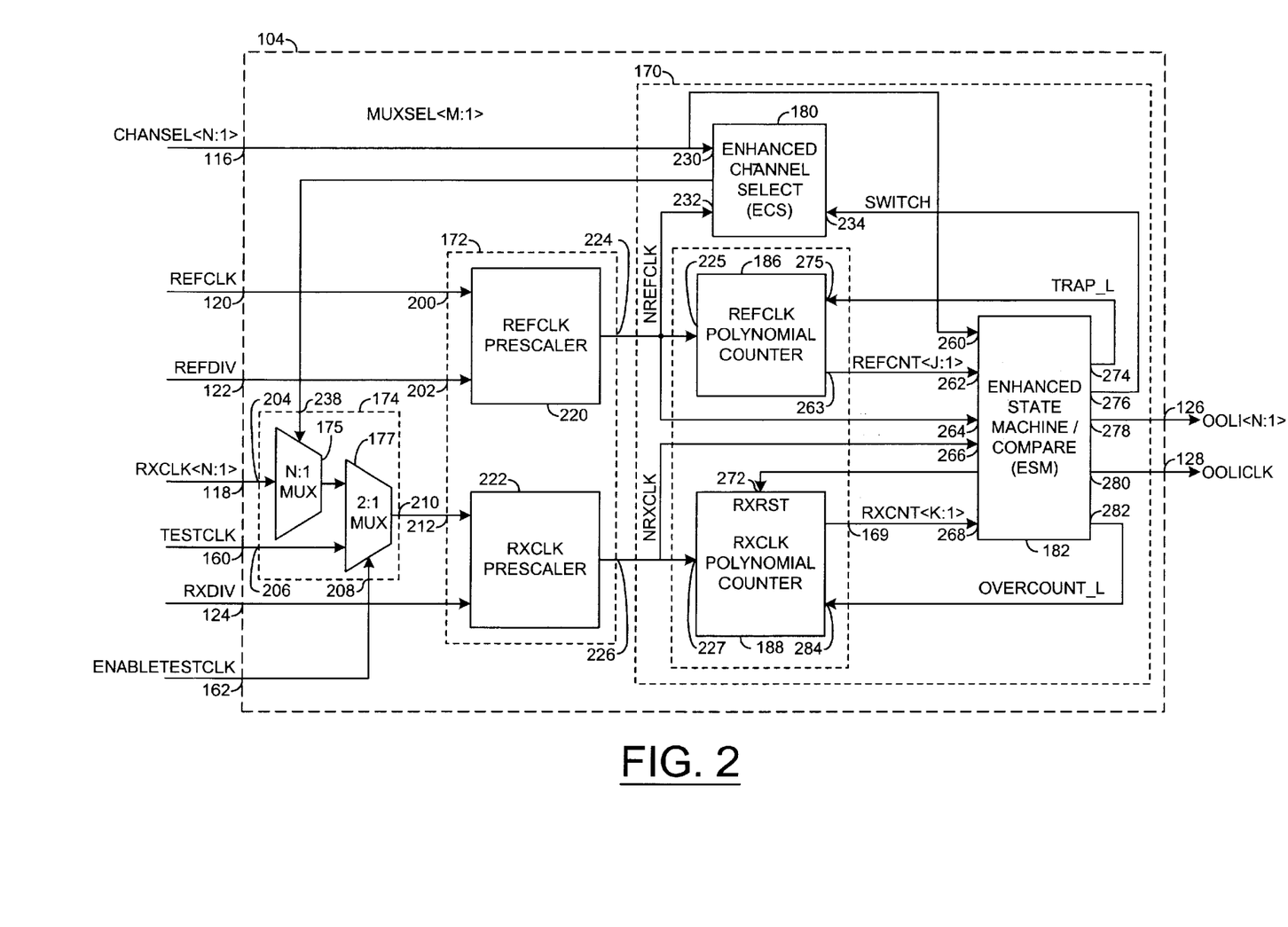
FIG. 2 is a detailed block diagram of the frequency difference detector of FIG. 1.

Referring to FIG. 2, a detailed diagram of the frequency difference detector circuit 104 is shown. FIG. 2 illustrates the circuit 104 further comprising an input 160 that may receive a clock signal (e.g., TESTCLK) and an input 162 that may receive an enable signal (e.g., ENABLETESTCLK). The frequency difference detector circuit 104 generally comprises a: control section (or circuit). 170, and a prescaler section (or circuit) 172 and a multiplexer section 174. The control circuit 170 generally comprises a channel select circuit 180, a state machine/compare section (or circuit) 182 and a counter section (or circuit) 184. The counter section 184 generally comprises a counter circuit 186 and a counter circuit 188. The multiplexer section 174 generally comprises a multiplexer 175 and a multiplexer 177.

The prescaler section 172 may have an input 200 that may receive the signal REFCLK and an input 202 that may receive the signal REFDIV. The multiplexer section 174 may have an input 204 that may receive the signal RXCLK<N:1>, an input 206 that may receive the signal TESTCLK and an input 208 that may receive the signal ENABLETESTCLK. The multiplexer section 174 may present a clock signal (e.g., the currently selected RXCLOCK) an output 210 that may be received at an input 212 of the prescaler section 172. The prescaler section 172 may also have an input 214 that may receive the signal RXDIV. The prescaler section 172 may comprise a reference clock prescaler 220 and a receive clock prescaler 222. The reference clock prescaler 220 may present a signal (e.g., NREFCLK) from an output 224 to an input 225 of the counter circuit 186. The receive clock prescaler 222 may present a signal (e.g., NRXCLK) from an output 226 to an input 227 of the counter circuit 188.

The channel select circuit 180 may have an input 230 that may receive the signal CHANSEL<N:1>, an input 232 that may receive the signal NREFCLK and an input 234 that may receive a signal (e.g., SWITCH). The channel select circuit 180 may present a signal (e.g., MUXSEL<M:1>) that may be presented to an input 238 of the multiplexer section 174. The signals CHANSEL<N:1>generally presents information to the channel select circuit 180 to select which channels are active and which channels are not active.

The channel select circuit 180 may be implemented as an enhanced channel select (ECS) circuit that may generate the signal MUXSEL<M:1>. When the signal SWITCH is asserted, the ECS circuit 180 generally updates the signal MUXSEL<M:1>to select the next active channel. The signal MUXSEL<M:1>generally controls the multiplexer 175 (e.g., an N:1 multiplexer) to choose the appropriate clock signal RXCLK<N:1>.

The state machine 182 may have an put 260 that receive signal CHANSEL<N:1>, an input 262 that may receive a signal (e.g., REFCNT<J:1>) from an output 263 of the counter 186, an input 264 that may receive the signal NREFCLK, an input 266 that may receive the signal NRXCLK, an output 270 that may present a signal (e.g., RXRST) to an input 272 of the counter 188, an input 268 that may receive a signal (e.g., RXCNT<K,:1>) from an output 269 of the counter 188, an output 274 that may present a signal (e.g., TRAP_L) to an input 275 of the counter 186, an output 276 that may present the signal SWITCH, an output 278 that may present the signal OOLI<N:1>, an output 280 that may present the signal OOLICLK and output 282 that may present a signal (e.g., OVERCOUNT_L) to an input 284 of the counter 188.

The state machine 182 may be implemented as an enhanced state machine/compare (ESM). The state machine 182 may compare the signal REFCNT<J:1>and the signal PXCNT<K:1>. Four sequential pulses may be generated from a particular REFCNT<J:1>: (i) a signal READ, (ii) a signal UPDATE, (iii) a signal SWITCH, and (iv) the reset signal RXRST. The signals READ and UPDATE will generally update the signal QOLI (e.g., on the rising edge of the signal UPDATE). The signal SWITCH may be presented to the state machine 182. The signal RXRST may be presented to the counter 188. In addition, the signal OOLICLK may be generated for further post processing of the signals OOLI<N:1>, if needed. The state machine 182 may also generate the signals TRAP_L and OVERCOUNT_L.

The prescaler 220 may be implemented as the reference clock prescaler (RFP) and the prescaler 222 may be implemented as a receive clock prescaler (RXP). The prescalers 220 and 222 generally divide the signal REFCLK and the signal RXCLK down in frequency, typically by integer values. For some architectures, the frequency of the signal REFCLK may differ from the frequency of the signal RXCLK, which may require different values of the signals REFDIV and RXDIV. In addition, power consumption savings can be achieved, if needed, by dividing the frequency of the signals REFCLK and RXCLK further than is functionally necessary at the expense of lock on time.

The counter 186 may be implemented as a reference clock polynomial counter (RCPC) sync counter. The counter 186 may be implemented as a free-running counter. The counter 186 may include circuitry to detect and recover from lock-up (or trap) states. The counter 188 may be implemented as a receive clock polynomial counter (RXPC). The counter 188 may be controlled by the state machine 182, and indirectly by the counter 186. The counter 188 may include circuitry to force the counter 188 into a trap state if the frequency of the signal RXCLK significantly exceeds the frequency of the signal REFCLK. The counter 188 remains in the trap state until the signal RXRST is asserted. The trap state may prevent the FDD 104 from inadvertently deasserting the signal OOLI when the frequency of the signal RXCLK is a frequency multiple of the frequency of the signal REFCLK.

Figure 3:
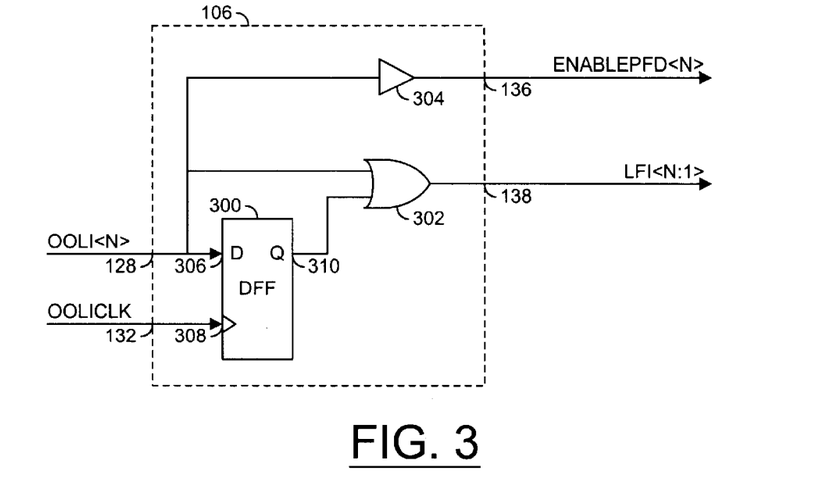
FIG. 3 is a detailed circuit diagram of the OOLI post processing circuit of FIG. 1.

Referring to FIG. 3, an example of the OOLI post processing circuit 106 is shown. The circuit 106 generally comprises a flip-flop 300, a gate 302 and a buffer 304. The signal OOLI<N:1>may be presented to an input 306 of the flip-flop 300, as well as to an input of the gate 302 and to the buffer 304. The signal OOLICLK may be presented to a clock input 308 of the flip-flop 300. The flip-flop 300 may present a signal at the Q output to a second input of the gate 302. In one example, the flip-flop 300 may be implemented as a D-type flip-flop. However, other flip-flops and/or latches, such as an SR-type latch may be implemented to meet the design criteria of a particular implementation. The gate 302 is shown implemented as an OR gate. However, other types of gates may be implemented with the appropriate conversions to meet the design criteria of a particular implementation. The buffer 304 may be implemented as a buffer with an inversion state in particular design implementations.

The signal TESTCLK is generally received in through the multiplexer 177 (e.g., a 2:1 MUX). The circuit 104 may also include some additional post processing of the signal OOLI. An example schematic and timing diagram are shown.

Figure 4:
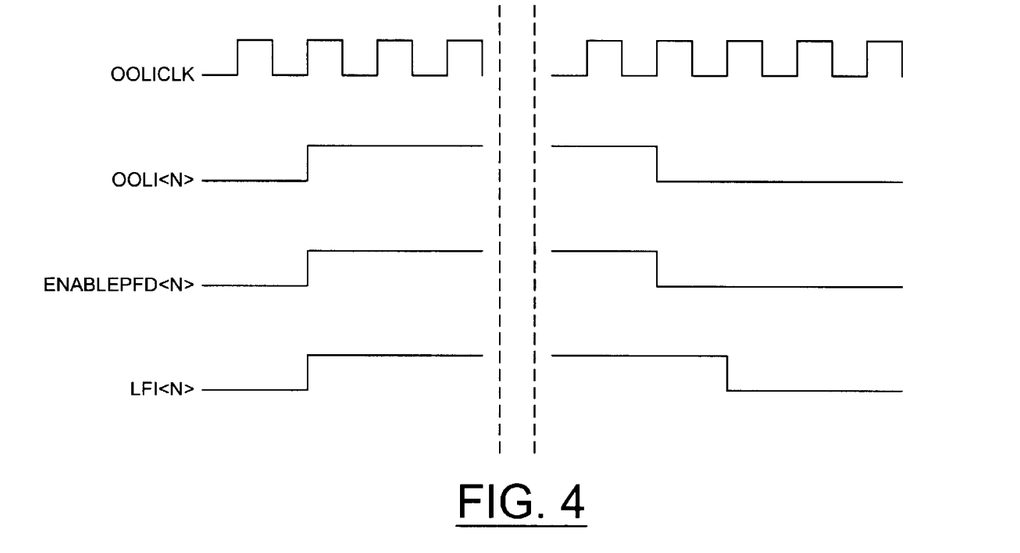
FIG. 4 is a timing diagram showing the operation of the OOLI post processing circuit of FIG. 1.
Figure 5:
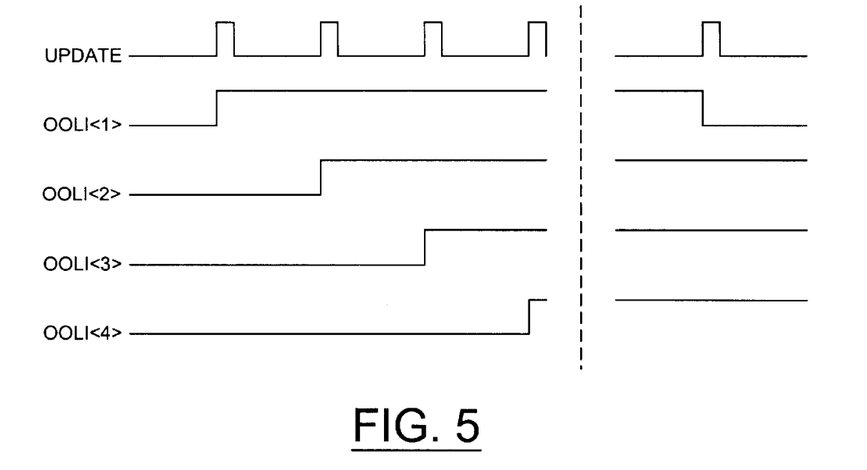
FIG. 5 is a timing diagram showing the operation of the frequency detection device of FIGS. 1 and 2.

Referring to FIGS. 4 and 5, a multichannel timing diagram of the frequency difference detector 104 is shown. The signals OOLI<N:1>are shown updated sequentially. The signal CHANSEL<N:1>is presented to the OOLI update circuit 406 (to be described in more detail in connection with FIG. 8). The signal OOLI is generally forced high if the frequency of a particular channel is inactive. The signal OOLI may provide range control.

Figure 6:
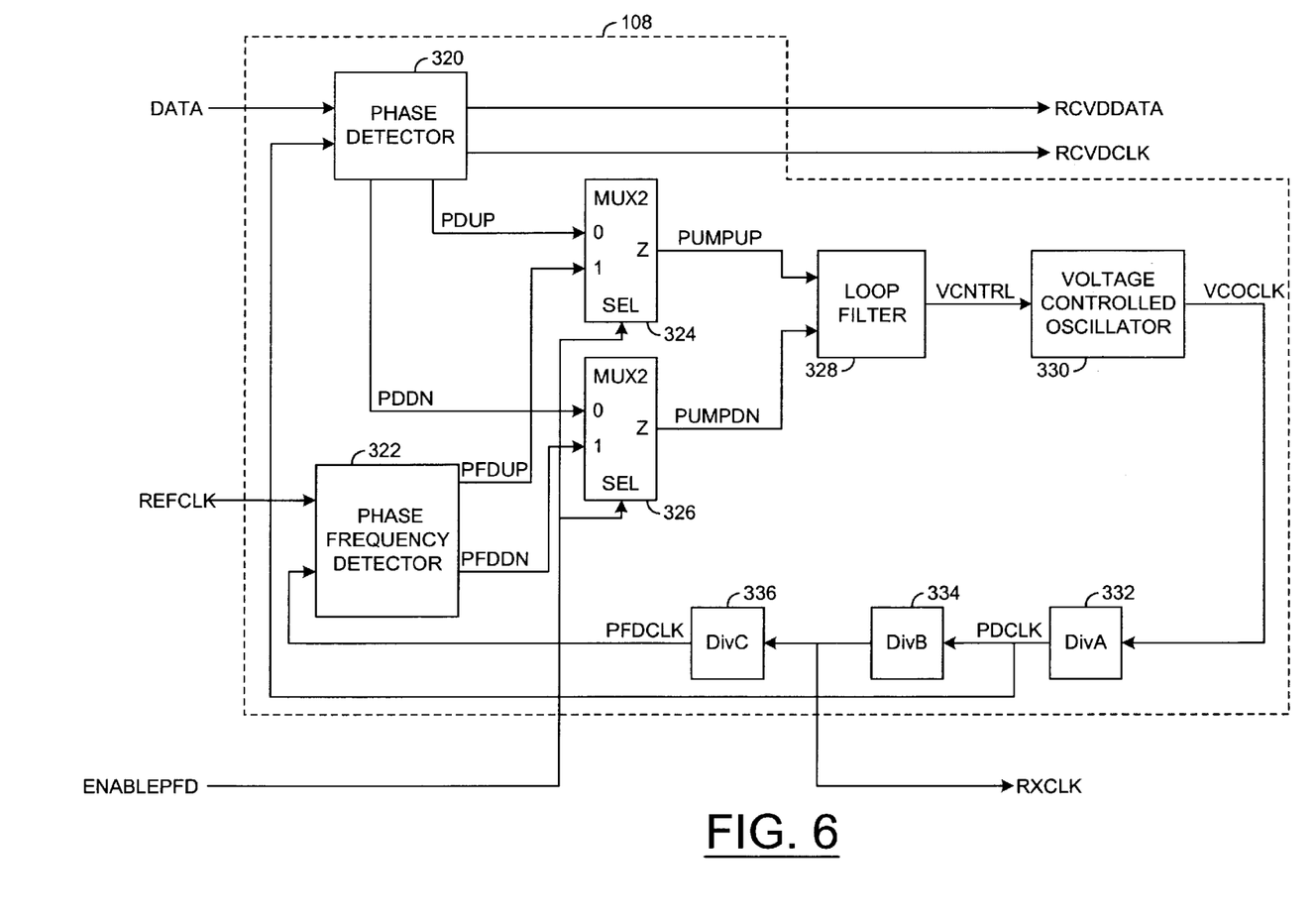
FIG. 6 is a data recovery PLL that may be used to implement the present invention.

Referring to FIG. 6, a detailed block diagram of one of Clock/Data Recovery PLLs 108a–108n is shown. The clock/data recovery PLL 108 generally comprises a phase detector 320, a phase frequency detector 322, a multiplexer 324, a multiplexer 326, a loop filter 328, a voltage controlled oscillator 330, a divide block 332, a divide block 334 and a divide block 336.

Figure 7:
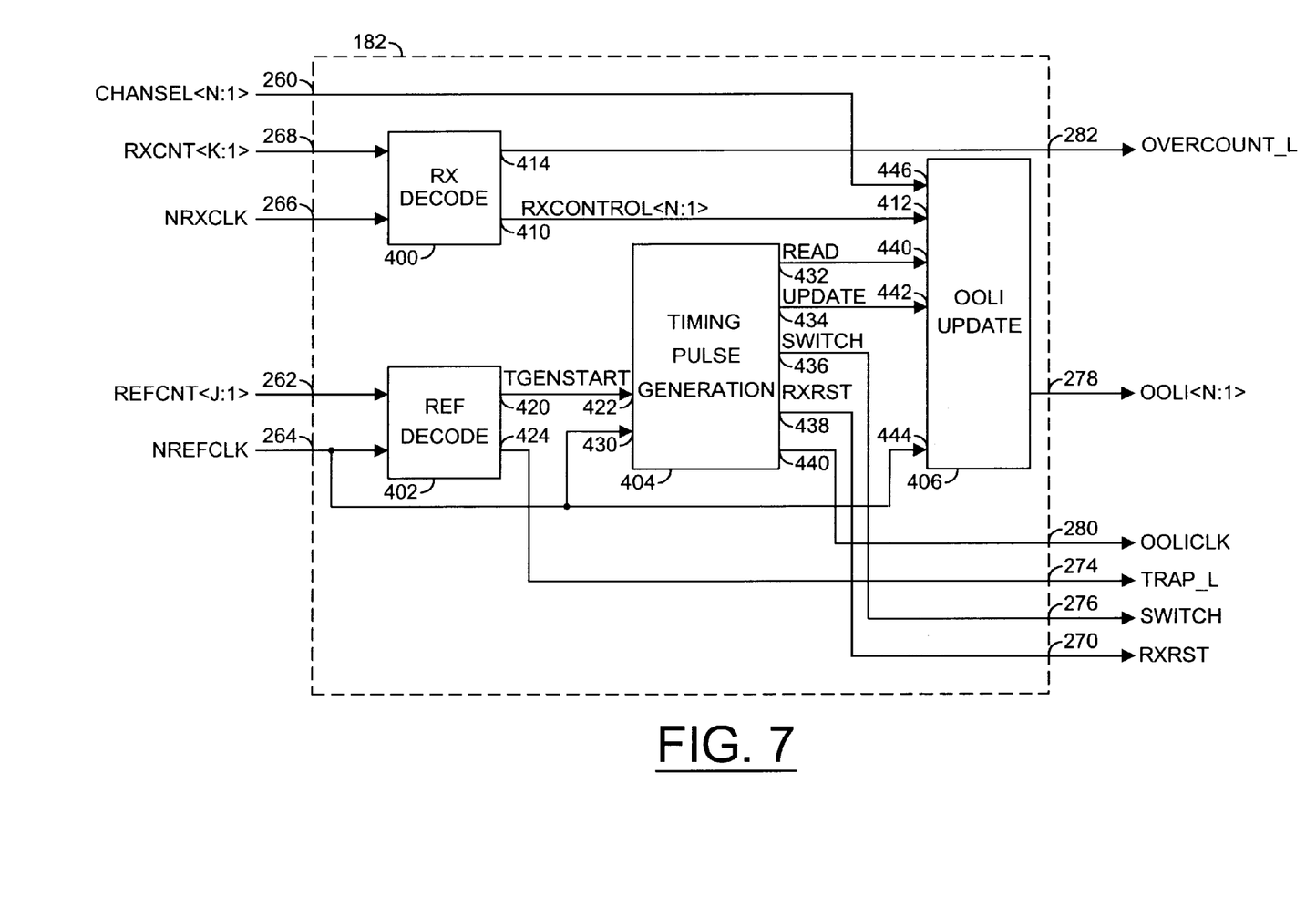
FIG. 7 is a detailed block diagram of the enhanced state machine of FIG. 2.

Referring to FIG. 7, a more detailed diagram of the state machine 182 is shown. The state machine 182 generally comprises a receive decoder block (or circuit) 400, a reference block (or circuit) decoder 402, a timing pulse generation block (or circuit) 404 and an OOLI update block (or circuit) 406. The decoder circuit 400 may present a signal (e.g., RXCONTROL) at an output 410 that may be presented to an input 412 of the OOLI update block 406. The decoder block 400 may present the signal RXCONTROL in response to the signal RXCNT<K:1>and the signal NRXCLK. The decoder block 400 may also present the signal OVERCOUNT_L at an output 414.

The decoder block 402 may present a signal (e.g., TGENSTART) at an output 420 that may be received at an input 422 of the timing pulse generation block 404. The decoder 402 may also present the signal TRAP_L at an output 424. The decoder 402 may present the signals TGENSTART and TRAP_L in response to the signals REFCNT<J:1>and the signal NREFCLK.

The timing pulse generation block 404 may also have an input 430 that may receive the signal NREFCLK. The timing pulse generation block 404 may present a signal (e.g., READ) at an output 432, the signal UPDATE at an output 434, the signal SWITCH at an output 436, the signal RXRST at an output 438 and the signal OOLICLK at an output 440. The block 406 may present the signal OOLI<N:1>in response to the signal READ received at an input 440, the signal UPDATE received at an input 442, the signal NREFCLK received at an input 444 and the signal CHANSEL<N:1>received at an input 446 and the signal RXCONTROL received at the input 412. The decoder block 400 and the timing pulse generation block 404 may provide hysteresis.

Figure 8:
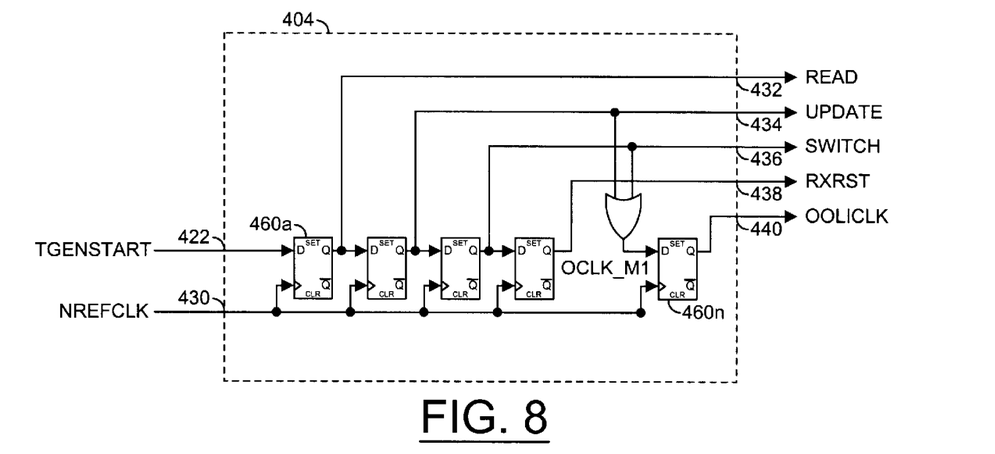
FIG. 8 is a detailed circuit diagram of the timing pulse generation circuit of FIG. 7.

Referring to FIG. 8, a more detailed diagram of the timing pulse generation circuit 404 is shown. The timing pulse generation circuit 404 generally comprises a number of flip-flops 460a–460n and a gate 462. The flip-flops 460a–460n may be implemented, in one example, as D-type flip-flops. However, other flip-flops/latches, such as a SR latch, may be implemented accordingly to meet the design criteria of a particular implementation.

Figure 9:
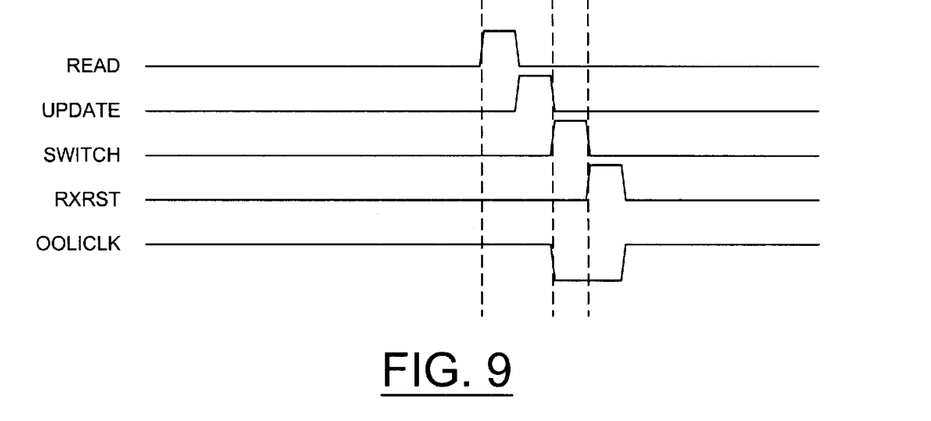
FIG. 9 is a timing diagram showing the operation of the timing pulse generation circuit.

Referring to FIG. 9, a timing diagram for the timing pulse generation block 404 is shown. The signals READ, UPDATE, SWITCH and RXRST generally sequentially pulse. The signal OOLICLK generally has a transition after the signal RXRST transitions.

Figure 10:
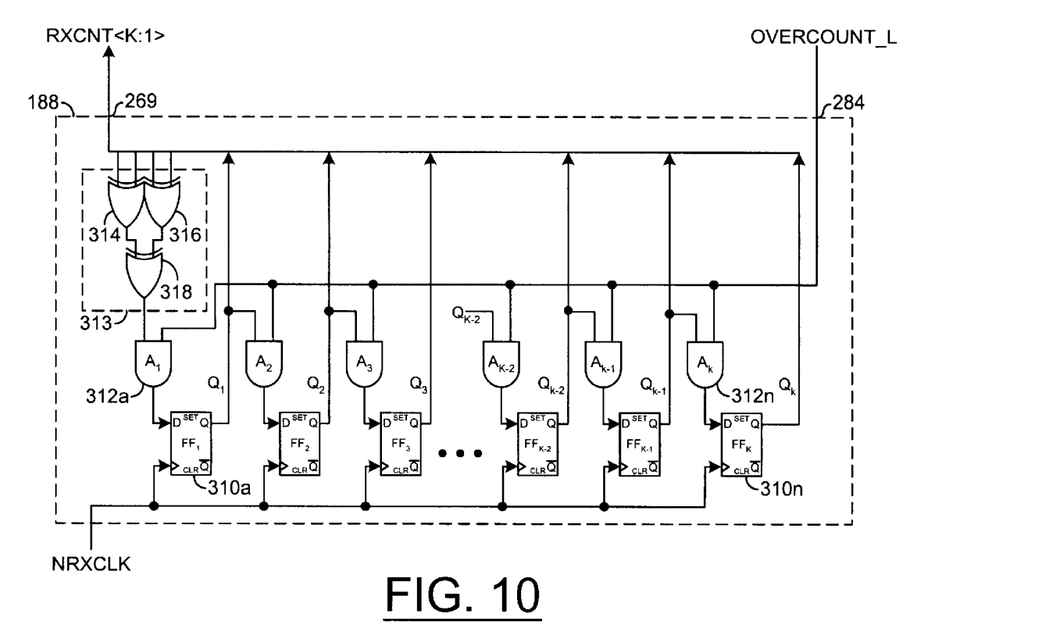
FIG. 10 is a detailed circuit diagram of the RXCLK polynomial counter circuit of FIG. 2.

Referring to FIG. 10, a detailed diagram of the counter 188 is shown. The counter 188 generally comprises a number of flip-flops 310a–310n, a number of gates 312a–312n and a circuit 313. The circuit 313 may comprise a gate 314, a gate 316 and a gate 318. The flip-flops 320a–320n may be implemented, in one example, as D-type flip-flops. However, other flip-flops/latches, such as a SR latch, may be implemented accordingly to meet the design criteria of a particular implementation. The gates 314, 316 and 318 may be implemented, in one example, as XOR gates. However, other types of gates may be implemented accordingly to meet the design criteria of a particular implementation. For a particular implementation, the signal OVERCOUNT_L may force the signal RXCNT<K:0> to all zeros. If a bit will naturally be zero, the AND gate 312a–312n for that particular flip-flop 310a–310n is not necessarily needed.

Figure 11:
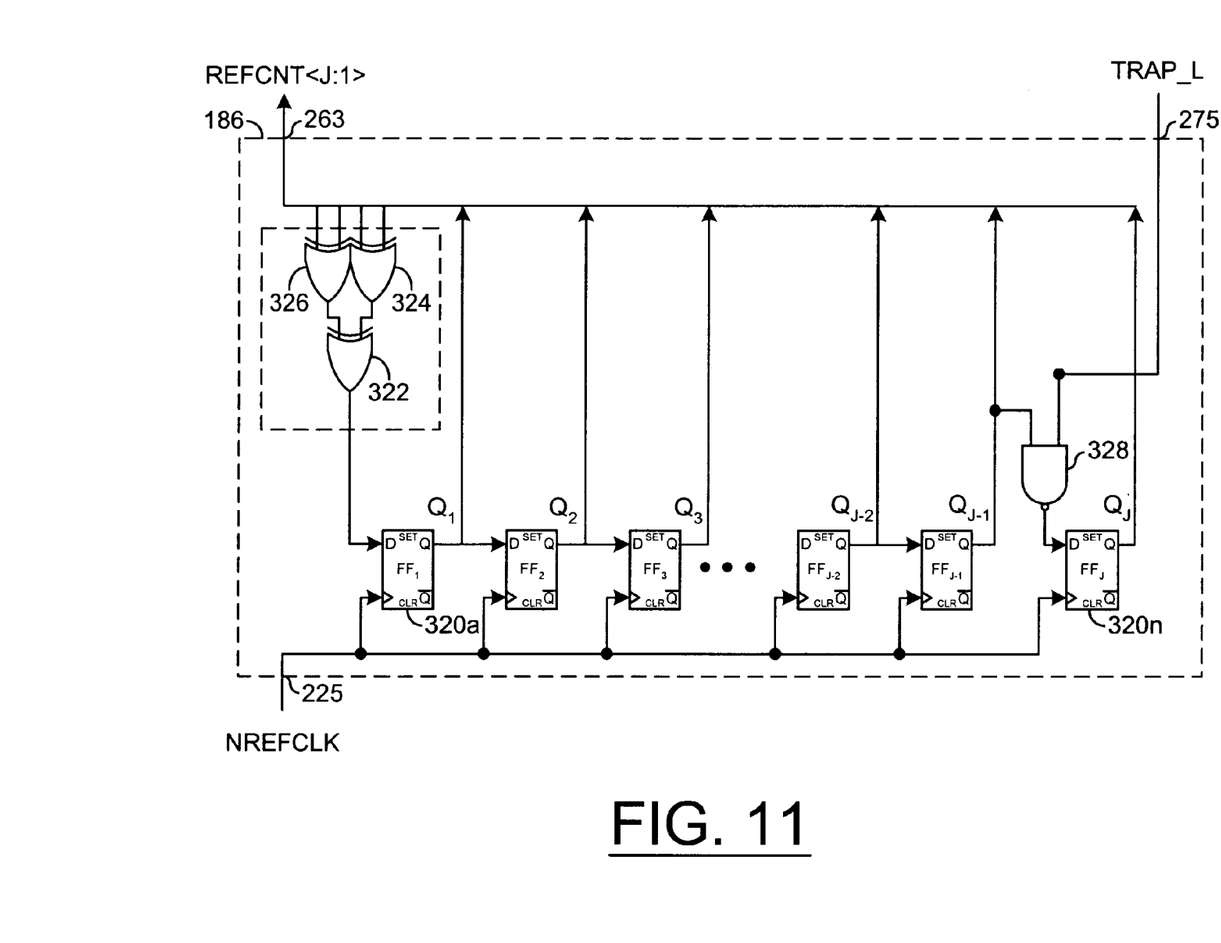
FIG. 11 is a detailed circuit diagram of the REFCLK polynomial counter circuit of FIG. 2.

Referring to FIG. 11, a detailed diagram of the counter 186 is shown. The counter 186 generally comprises a number of flip-flops 320a–320n, a circuit 321, and a gate 323. The circuit 321 may comprise a gate 322, a gate 324 and a gate 326. The flip-flops 320a–320n may be implemented, in one example, as D-type flip-flops. However, other flip-flops/latches, such as a SR latch, may be implemented accordingly to meet the design criteria of a particular implementation. The gates 322, 324 and 326 may be implemented, in one example, as XOR gates. However, other types of gates may be implemented accordingly to meet the design criteria of a particular implementation. The gate 328 may be implemented, in one example, as a NAND gate. However, a gate 328 may be implemented as a number of gate types to meet the design criteria of a particular implementation. For a particular implementation, the signal TRAP_L may force the signal REFCNT<J:1>to all zeros. If a bit will naturally be zero, the AND gate 312a–312n for that particular flip-flop 310a–310n is not necessarily needed.

The present invention may have a programmable number of channels, as controlled by the state machine 182. The programmable channels may have the advantages allowing (i) channels that are inactive do not delay the evaluation of active channels and (ii) a more efficient network startup and recovery from error conditions. In addition, the invention may be optimized for BBDM, allowing it to be used on a number of transceivers with different channel counts. The structure of the polynomial counters 186 and 184 may allow for high speed operation (e.g., an operational speed of 1 Gbits/s or more) . The addition of the signal OOLICLK may allow for device specific post processing of the signal OOLI.

The signal TESTCLK may be integrated into the structure, and may avoid awkward multiplexing elsewhere. The signal TESTCLK is included after the multiplexer 175, so only one test clock is needed, instead of one per input channel.

Figure 12:
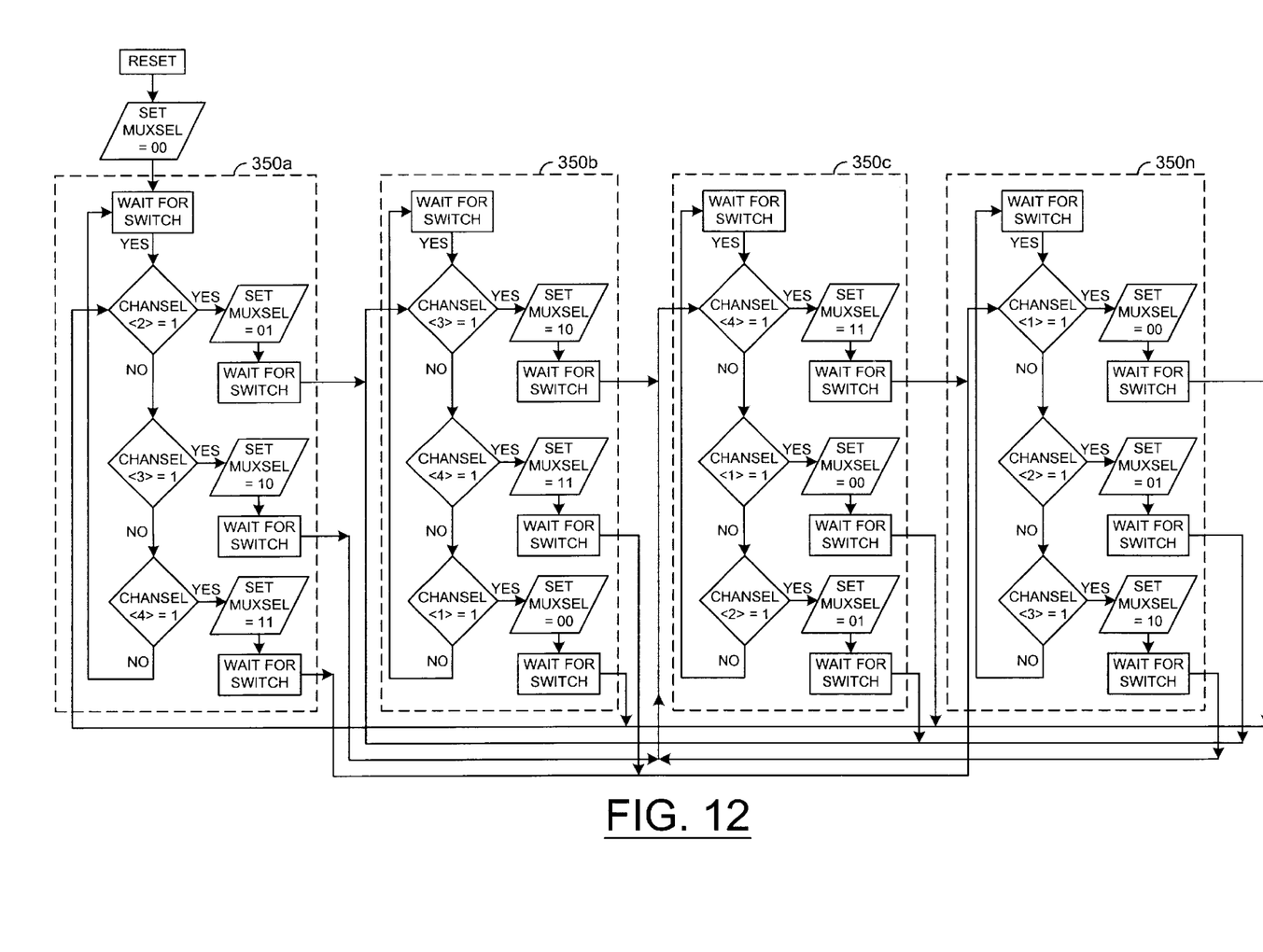
FIG. 12 is a flow diagram illustrating the operation of the enhanced state machine circuit of FIG. 2.

Referring to FIG. 12, a flow diagram illustrating the operation of the state machine 182 is shown. The flow diagram of FIG. 12 generally comprises a number of select sections 350a–350n. Initially, the signal MUXSEL is set to "00" (e.g., 1). Each of the select sections 350a–350n generally idles at a particular state until the signal CHANSEL changes state. For example, the select section 350a generally idles with the signal CHANSEL equal to "00" (e.g., 0). If the signal CHANSEL is equal to 2, the selection section 350a generally sets the signal MUXSEL equal to "01" (e.g., 1) and moves to the selection section 350b. If the signal CHANSEL is equal to 3, the selection section 350a generally sets the signal MUXSEL equal to "10" (or 2) and moves to the select section 350c. If the signal CHANSEL is equal to 4, the select section 350a generally sets the signal MUXSEL to "11" (e.g., 4) and moves to the select section

350*n*. While FIG. 4 is shown implementing a 4-state state machine 182, other number of states may be implemented accordingly to meet the design criteria of a particular implementation. Additionally, the state machine 182 may switch between a particular sub-set of the select sections 350*a*–350*n*. For example, the state machine 182 may repeatedly switch between the select section 350*a* and the select section 350*c*. Other sub-sets of the select sections 350*a*–350*n* may be selected to meet the design criteria of a particular implementation. In one example, the state machine may be implemented using a software design tool, such as the VERILOG hardware description language (HDL) as defined by the IEEE 1364–1995 standard.

Figure 13:
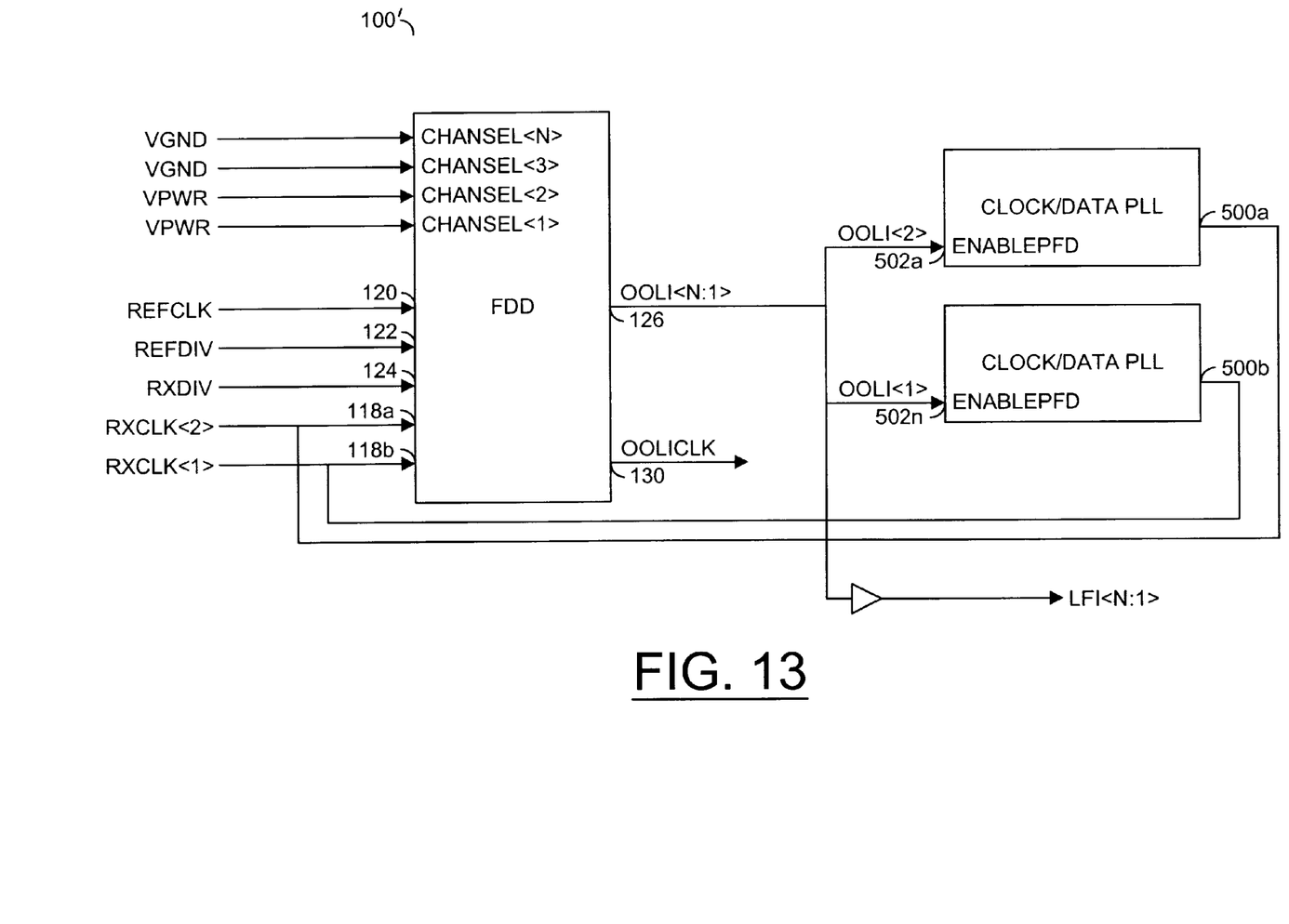
FIG. 13 is a block diagram of an alternative embodiment of the present invention.

Referring to FIG. 13, an alternate implementation of the frequency difference detector 104 implemented in a circuit 100' is shown. The circuit 100' is shown implementing the phase frequency detector 104 without the post processing block 106 (of FIG. 2).

The signals RXCLK<1>and RXCLK<2> are shown presented both to inputs 118*a* and 118*b* as well as to inputs 500*a* and 500*b* of the clocks/data PLLS 108*a*–108*n*. Inputs 502*a* and 502*n* may receive a particular bit of the signal OOLI<N:1>.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising first circuit configured to present one or more control indication signals in response to (i) one or more select signals, (ii) one or more clock signals and (ii) one or more divider control signals, wherein said first circuit is configured to select an active channel from a plurality of channels in response to said one or more select signals; and
   a second circuit configured to generate said one or more select signals in response to (i) one or more external select signals and (ii) one or more external power, down signals.

2. The apparatus according to claim 1, wherein said active channel is updated at a periodic predetermined interval.

3. The apparatus according to claim 1, wherein the number of said plurality of channels is programmable in response to a channel select circuit.

4. The apparatus according to claim 3, wherein said second circuit generates said one or more select signals in further response to one or more external power down signals.

5. The apparatus according to claim 1, wherein said first circuit is further configured to generate a control clock signal.

6. The apparatus according to claim 5, further comprising:
   an enable circuit configured to generate one or more enable signals in response to said one or more control indication signals and said control clock signal.

7. The apparatus according to claim 1, wherein said one or more clock signals are compared to a reference clock signal to generate said one or more control indication signals.

8. The apparatus according to claim 1, wherein said first circuit further comprises:
   a multiplexer circuit configured to present a first internal clock in response to said one or more clock signals and a test clock input.

9. The apparatus according to claim 1, wherein said first circuit further comprises:

a prescaler circuit configured to generate one or more internal clock signals in response to one of said one or more clock signals.

10. The apparatus according to claim 9, wherein said first circuit further comprises:
    an output circuit configured to generate said one or more control indication signals and said control clock signal in response to said one or more internal clock signals.

11. The apparatus according to claim 10, wherein said output circuit comprises a state machine configured to generate said one or more control indication signals and said control clock signal in response to said internal clock signals.

12. The apparatus according to claim 11, wherein said output circuit further comprises one or more counters configured to process said internal clock signals prior to presenting said internal clock signals to said state machine.

13. The apparatus according to claim 12, wherein said one or more counters comprise high speed polynomial counters.

14. The apparatus according to claim 12, wherein said one or more counters further respond to a trap signal.

15. The apparatus according to claim 12, wherein said one or more counters further respond to an overcount signal.

16. The apparatus according to claim 14, wherein said state machine comprises a timing pulse generation circuit configured to generate said overcount signal.

17. apparatus comprising: for generating one or more control indication signal in response to (i) one or more select signals, (ii) one or more clock signals and (iii) one or more divider clock signals;
    means for selecting an active channel from a plurality of channels.in response to said one or more select signals; and
    means for generating one or more select signals in response to (i) one or more external select signals and (ii) one or more external power down signals.

18. A method for controlling a frequency difference detector comprising the steps of:
    (A) generating one or more control indication signals in response to (i) one or more select signals, (ii) one or more clock signals and (iii) one or more divided clock signals;
    (B) generating an active channel from a plurality of channels in response to said one or more select signals; and
    (C) generating one or more select in response to (i) one or more external select signals and (ii) one or more external power down signals.

19. An apparatus comprising:
    a first circuit configured to present one or more control indication signals in response to (i) one or more select signals, (ii) one or more clock signals and (iii) one or more divider control signals, wherein said first circuit is configured to select an active channel from a plurality of channels in response to said one or more select signals; and
    one or more clock/data PLL circuits each configured to receive an enable signal.

20. The circuit according to claim 19, further comprising a second circuit configured to generate said one or more select signals in response to one or more external select signals.

* * * * *